(12) United States Patent
Li et al.

(10) Patent No.: US 6,184,103 B1
(45) Date of Patent: Feb. 6, 2001

(54) HIGH RESISTANCE POLYSILICON SRAM LOAD ELEMENTS AND METHODS OF FABRICATING THEREFOR

(75) Inventors: Jia Li; Yaoxiong Wu, both of San Antonio, TX (US)

(73) Assignees: Sony Corporation, Tokyo (JP); Sony Electronics Inc., Park Ridge, NJ (US)

( * ) Notice: Under 35 U.S.C. 154(b), the term of this patent shall be extended for 0 days.

(21) Appl. No.: 09/105,579

(22) Filed: Jun. 26, 1998

(51) Int. Cl.[7] .................................................. H01L 29/00
(52) U.S. Cl. ........................ 438/382; 438/384; 438/385; 438/210
(58) Field of Search ................................. 438/210, 382, 438/384, 385; 257/379, 380, 538, 537, 904

(56) References Cited

U.S. PATENT DOCUMENTS

| | | | |
|---|---|---|---|
| 4,208,781 | * 6/1980 | Rao et al. | 438/385 |
| 4,604,789 | * 8/1986 | Bourassa | 438/385 |
| 5,414,291 | 5/1995 | Miwa et al. . | |
| 5,470,779 | * 11/1995 | Yoo | 438/385 |
| 5,585,302 | 12/1996 | Li . | |
| 5,622,887 | 4/1997 | Miwa et al. . | |
| 6,015,994 | * 1/2000 | Nakamura | 257/380 |

* cited by examiner

*Primary Examiner*—J. Carroll
(74) *Attorney, Agent, or Firm*—Christopher M. Tobin; Harold T. Fujii

(57) ABSTRACT

The present invention provides stable and reliable extremely high resistance polysilicon resistors for use as SRAM load elements, and methods for their fabrication. In an embodiment, a resistor element of a semiconductor device includes at least one polysilicon layer, and a silicon nitride layer deposited directly onto this polysilicon layer. The silicon nitride layer prevents contamination of the polysilicon layer during subsequent fabrication process steps. A method of fabricating a polysilicon resistor on a semiconductor substrate is also provided. The method includes the step of depositing a layer of polysilicon on the substrate, followed by depositing a layer of protective material over the polysilicon layer to form a protected polysilicon layer. After deposition of the protective layer, resistors are formed by implanting dopants into the polysilicon layer, and patterning through lithography, and etching the nitride and the polysilicon layer. The step of depositing a layer of protective material can include depositing a layer of silicon nitride. Dopants can be selected from a group consisting of boron, phosphorous, and arsenic, and can be implanted at dosage levels generally within a range of between zero and $5*10^{13}$ ions/cm$^2$ and at energy levels generally within a range of between 35 KeV and 80 KeV.

7 Claims, 4 Drawing Sheets

HIGH RESISTANCE POLYSILICON SRAM LOAD ELEMENTS AND METHODS OF FABRICATING THEREFOR

FIELD OF THE INVENTION

The invention relates generally to semiconductor devices and methods for fabricating semiconductor devices. More particularly, the present invention relates to stable, reliable, and extremely high resistance polysilicon resistors used as load elements in semiconductor memory devices such as SRAMs (Static Random Access Memory), and to methods of fabricating such load elements.

DESCRIPTION OF RELATED ART

From the very origins of the field of semiconductor electronics, there has been an almost inexorable quest for smaller and more powerful devices. With decreased size and increased power, the demands of reliability and stability of each component becomes increasingly critical. These demands are arguably greatest in the area of memory components.

For example, semiconductor SRAM (Static Random Access Memory) devices have become increasingly common due to their compactness and power. A memory cell of a typical SRAM device has either six transistors ("6T"), or four transistors and two resistors ("4T2R"). Due to its smaller size, a 4T2R memory cell SRAM device is preferable to a 6T memory cell SRAM device, since a wafer will likely yield a greater number of 4T2R memory cell SRAM chips.

A drawback, however, of 4T2R memory cell SRAM devices is that they typically require a higher standby current than 6T memory cell SRAM devices. In 4T2 memory cell SRAM devices, the standby current is determined by the memory size, the supply voltage, and the resistance of resistor elements. For a given application, the memory size and the supply voltage of a SRAM device are fixed. In order to minimize standby current it is very desirable to have resistor elements with high resistance values.

Depending on a targeted application for a SRAM device, the required resistance of the SRAM device resistor elements can range from a few hundred Gigaohms to more than ten Teraohms. In some common applications, such as cellular phones and palmtop computers, SRAM devices having extremely low standby currents are used. In such applications, therefore, the SRAM device resistor elements require resistance values in the Teraohm range.

It has proven to be relatively difficult to manufacture SRAM devices having uniform, stable, and reliable high resistance resistor elements. Instability and unreliability in SRAM device resistor elements are sometimes caused by contamination created or introduced during the SRAM device fabrication process. Contamination of semiconductor wafers having SRAM devices can be reduced by cleaning the wafer during the fabrication process. However, cleaning the wafer may also remove a portion of the polysilicon layer forming the SRAM device resistor element, resulting in a polysilicon layer having a nonuniform thickness. This thickness nonuniformity causes the SRAM device resistor elements to suffer from resistance shift or variations in resistance.

The unreliability and instability of SRAM devices due to defective resistance elements can have severe consequences. If the defective SRAM chips make their way into consumer electronics, the result will be a returned product and a damaged reputation for the manufacturer. At the very least, the rejection of unacceptable chips during quality control in the fabrication process is expensive and wasteful.

It can be seen from the foregoing that the need exists for an SRAM device that can be inexpensively and easily fabricated with uniform, extremely high resistance, stable, and reliable resistor elements.

SUMMARY OF THE INVENTION

The present invention achieves these and other objects by providing stable and reliable extremely high resistance polysilicon resistors for use as load elements for a SRAM device, and methods for their fabrication.

In one embodiment of the present invention, at least one of a plurality of resistor elements of a semiconductor device includes a polysilicon layer, and a silicon nitride layer disposed directly onto the polysilicon layer. The silicon nitride layer prevents contamination of the polysilicon layer during subsequent fabrication process steps, performed on the polysilicon and the silicon nitride layers, that form at least one of a plurality of resistors A method of fabricating a polysilicon resistor on a semiconductor substrate is also provided. The method includes the step of depositing a layer of polysilicon on the substrate, followed by depositing a layer of protective material over the polysilicon layer to form a protected polysilicon layer. After deposition of the protective layer, resistors are formed by selectively implanting dopants through the layer of protective material and into the polysilicon layer. The dopant material can be selected from a group consisting of boron, phosphorous, and arsenic, and can be implanted at dosage levels up to $5*10^{13}$ ions/cm$^2$ and at energy levels generally within a range of between 35KeV and 80KeV, depending the thickness of the polysilicon layer, and the thickness and material of the protective layers.

The step of forming resistors can include the steps of defining resistors and connection lines on the layer of protective material via photolithography, etching a portion of the protective layer and the polysilicon layer not covered with photoresist, and then removing any remaining photoresist and cleaning the substrate. Next, highly conductive regions of the protected polysilicon layer are formed by defining these regions via photolithography, and implanting dopants through the protective layer into the polysilicon layer in those portions of the protected polysilicon layer not covered with photoresist, and then removing the photoresist and cleaning the substrate.

In another embodiment, a method of processing a silicon wafer to fabricate polysilicon resistors or load elements SRAMs is described. The method includes steps of forming polysilicon resistors as load elements of a SRAM device after a silicon wafer has been processed with conventional processing techniques following a conventional processing sequence from an initial starting step or stage and up to the processing step or stage where the silicon wafer has been coated with a layer of polysilicon (i.e., the uppermost or last polysilicon layer) wherein resistor load elements of the SRAM device and some connection lines will be formed. At this stage of the fabrication process, in addition to this last polysilicon layer, the silicon wafer has bulk silicon transistors already formed therein. Another polysilicon layer (i.e., the first polysilicon layer) serves as the gate electrode for these bulk silicon transistor. Interconnects have been formed with a second polysilicon layer, contact holes have been opened and filled with the second and the last polysilicon layers, and oxide layers have been deposited between the first and second polysilicon layers and between the second and the last polysilicon layers. The first and the second polysilicon layers usually have tungsten silicide or tantalum silicide claddings. A layer of silicon nitride is then deposited onto the silicon wafer and is disposed onto the last polysilicon layer to form a protected polysilicon layer. A dopant can be implanted through the silicon nitride layer into the last polysilicon layer. Next, polysilicon resistors and connection lines are defined on the protected polysilicon layer using a first photoresist material layer deposited, selectively exposed, and developed via conventional photolithography. The portion of the protected polysilicon layer not covered with photoresist is etched off, and then any remaining material of the first photoresist material layer is removed and the wafer is cleaned. In a next step, highly conductive regions of the protected polysilicon layer are photolithographically defined. Dopant is again implanted through the silicon nitride layer into the last polysilicon layer in regions of the protected polysilicon layer which are not covered with a second photoresist material layer. The remaining developed second photoresist material layer is removed, and the wafers are cleaned.

The features of the invention believed to be patentable are set forth with particularity in the appended claims. The invention itself, however, both as to organization and method of operation, together with further objects and advantages thereof, may be best understood by reference to the following description taken in conjunction with the accompanying drawings.

DETAILED DESCRIPTION OF A PREFERRED EMBODIMENT

Figure 1:
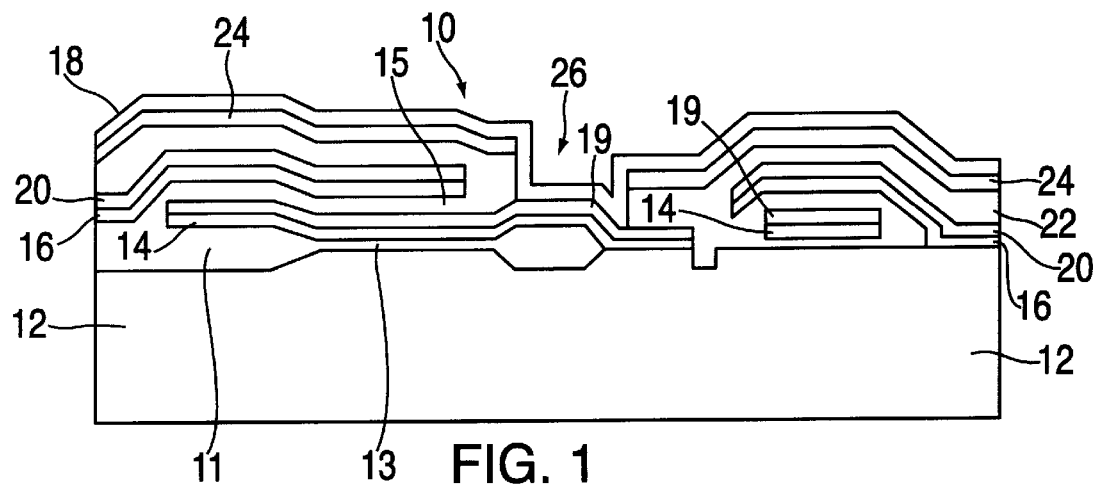
FIG. 1 illustrates a schematic cross-sectional view of a step in a conventional method of manufacturing a SRAM device wherein a polysilicon layer is disposed as the uppermost layer.

While this invention is susceptible of embodiment in many different forms, there is shown in the drawings, and will herein be described in detail, exemplary embodiments, with the understanding that the present disclosure is to be considered as illustrative of the principles of the invention and not intended to limit the invention to the exemplary embodiments shown and described. It will also be appreciated that like materials depicted in subsequent figures will be labeled with identical numerals.

FIG. 1 illustrates a memory device, here shown as an SRAM device 10, at an interim step of a conventional SRAM fabrication process. The SRAM device 10 includes a substrate 12 which may, for example be provided as a silicon, silicon on insulator, or other substrate commonly used in the manufacture of semiconductors. In the illustrated example, the substrate 12 is shown as a silicon wafer.

The SRAM device 10 is shown with most of its structure already in place. The SRAM device 10 includes a plurality of layers of different composition generally disposed with one layer on top of another layer. A bottommost layer being disposed onto the substrate. A portion of the plurality of layers of different composition forming a plurality of transistors, interconnect lines, and inter-level insulating layers. The illustrated SRAM device 10 includes polysilicon layers 14, 16, and 18 in conjunction with tungsten silicide or tantalum silicide layers 19 and 20, silicon dioxide layers 11, 13, 15 and 22, and silicon nitride layers 24. These layers are formed using thermal oxidation, low pressure chemical vapor deposition, atmospheric pressure chemical vapor deposition, photolithography, and reactive ion etching, all known to one skilled in the field, and they are formed in a sequence commonly practiced in the IC industry. In combination, these layers form the structural basis for the SRAM device 10.

A material or polysilicon layer 18 is disposed as an uppermost layer on the SRAM device 10. The polysilicon layer 18 has a thickness of approximately 250 Å, and is a layer upon which at least one of a plurality of polyresistor or resistor elements of the SRAM device 10 will be defined. The polysilicon layer 18 also fills a contact hole 26 formed through at least one of the plurality of layers of different composition of the SRAM device 10. The polysilicon layer 18 is typically implanted with a dopant, for example, Boron, Phosphorous, or Arsenic to form a doped polysilicon layer. The species, dose, and energy of the implant are selected in a known way so that the polyresistor will have the desired level of resistance.

After an initial dopant implant, the areas forming the polyresistors and connection lines are defined by photolithography. Generally, this process involves coating or depositing a layer of a photoresist material 28 on the upper surface of the doped polysilicon layer 18, exposing predetermined areas of the photoresist material layer to a light that is illuminated through a mask, dissolving or developing those areas of photoresist material layer that have been exposed to the light so as to expose portions of the upper surface of the doped layer. The exposed portions of the upper surface of the doped layer are then etched using, for example, a plasma etcher or other suitable apparatus.

Figure 2:
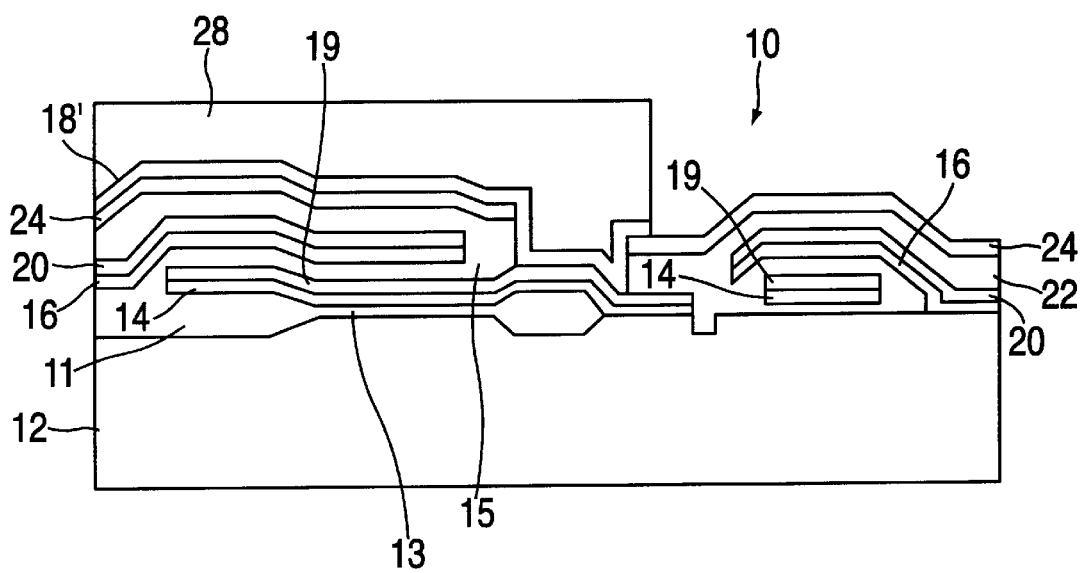
FIG. 2 to FIG. 3 illustrate schematic cross-sectional views of the SRAM device of FIG. 1 at subsequent steps in the conventional manufacturing method.
Figure 3:
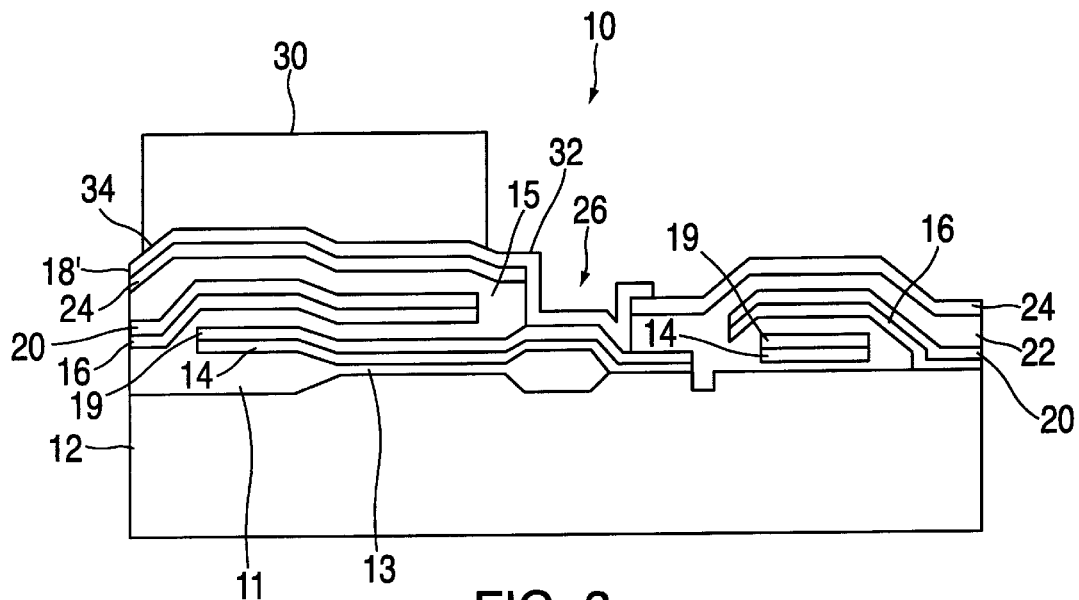

FIG. 2 to FIG. 3 illustrate schematic cross-sectional views of the SRAM device of FIG. 1 at subsequent steps in the conventional manufacturing method. More specifically, FIG. 2 illustrates the SRAM device 10 after a portion of the doped polysilicon layer 18 has been etched, but before the photoresist material 28 has been removed. A polysilicon layer portion 18' which remains after etching, forms a plurality of polyresistors and/or connection lines. After etching step, the photoresist material 28 is removed, and the wafer is cleaned and dried.

Next, photolithography is again employed, to define those areas of the polysilicon layer portion 18' which should be highly conductive in the finished device. FIG. 3 illustrates the SRAM device 10 after a second photoresist material layer 30 disposed onto the polysilicon layer portion 18' and the silicon nitride layer 24, has been masked, exposed, and developed so as to leaves regions 32 and 34 of the polysilicon layer portion 18' exposed. The exposed regions 32, 34 are then implanted with a dopant, such as Arsenic or Phosphorous, which will render the implanted areas highly conductive. After implantation, the remaining photoresist material 30 is removed, and the wafer is cleaned and dried. The wafer is at this point ready for subsequent processing as necessary.

As previously discussed, the photolithography and etching processes increase the level of contamination, and the cleaning process that is required to reduce the level of contamination reduces the thickness and the uniformity of thickness of the polysilicon layer 18. The present invention, as illustrated in FIG. 4 through FIG. 7, eliminate these drawbacks of the conventional process illustrated in FIG. 2 and FIG. 3.

Figure 4:
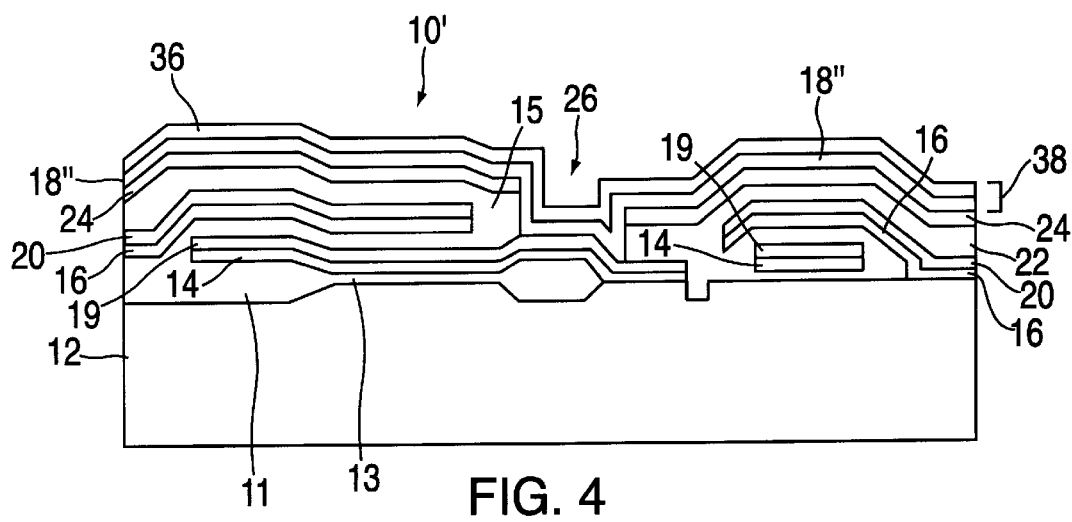
FIG. 4 depicts a schematic cross-sectional view of a step in a method of manufacturing a SRAM device, embodying principles of the present invention.

FIG. 4 depicts a schematic cross-sectional view of a step in a method, embodying principles of the present invention, of manufacturing a semiconductor SRAM device having at least one high resistance polysilicon resistor or load element. An SRAM device 10' which is nearly identical to the SRAM device 10 (FIG. 1 ), is illustrated. However, a protective layer 36 has been deposited over a polysilicon or material layer 18" (which is substantially identical to layer 18) to form a protected polysilicon layer or protected material layer 38. It is contemplated that the protective layer 36, made of silicon nitride, with a thickness of approximately 110Å, is effective, although other materials at other thicknesses could also be used. The protective layer 36 prevents contamination of the polysilicon layer 18" during subsequent SRAM fabrication steps which are performed on both the polysilicon layer 18" and the protective layer 36 in order to form resistor or load elements for the illustrated SRAM device 10'. More specifically, the protective layer 36 insulates the polysilicon layer 18" against particulate contamination from the photolithographic process, eliminates the need for excessive cleaning with hydrofluoric acid, and shields the polysilicon layer 18" from the surface and thickness irregularities caused by cleaning procedures conducted in subsequent steps of the SRAM device fabrication process.

A resistor element or load element of the SRAM device 10' will be formed in a portion of the protected polysilicon layer 38. The protected polysilicon layer 38 is initially implanted with a dopant, for example, Boron, Phosphorous, or Arsenic in order to control the resistivity and conductance of the ultimately formed resistor element. As with the conventional process, the species, dose, and energy of the implant are selected in a known way so that the resistor element in the polysilicon will have the desired level of resistance. However, the species, dose, and energy of the implant may have to be changed from the conventional process so that the dopant can pass through the protective layer 36 and still achieve the desired effect upon the underlying polysilicon layer 18". It has been found that the implantation of Phosphorous at a dosage of $1.5*10^{13}$ ions/$cm^2$ and an energy level of 35KeV is effective, although other species, at other doses and energy levels could also be suitable.

Figure 5:
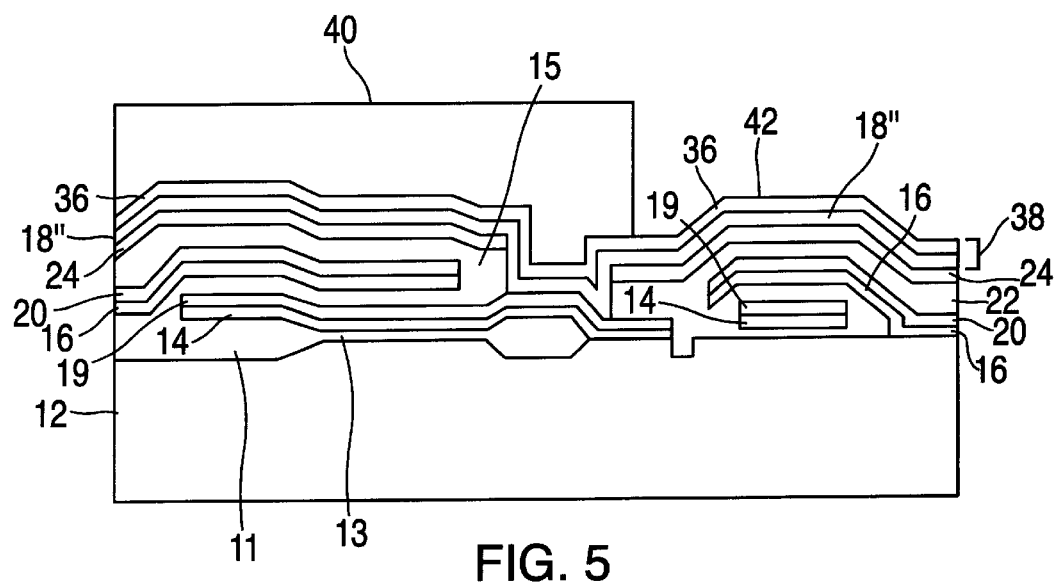
FIG. 5 to FIG. 7 depict schematic cross-sectional views of the SRAM of FIG. 4 at subsequent steps in the manufacturing method embodying principles of the present invention.

After the initial dopant implant, the areas forming the polyresistors and connection lines are defined by photolithography, in the polysilicon layer 18" of the protected polysilicon layer 38. Generally, this process involves coating or depositing a first photoresist material layer on the upper surface of the protective layer 36. Then, the first photoresist material layer is aligned with a mask to expose a portion of the first photoresist material layer to a light that is illuminated through the mask. The exposed portions of the first photoresist material layer is then developed to form a patterned, developed first photoresist material layer 40 which, as illustrated in FIG. 5, covers a masked portion of the protected polysilicon layer 38 and also exposes or uncovers regions or unmasked portion 42 of the upper surface of the protected polysilicon layer 38.

Figure 6:
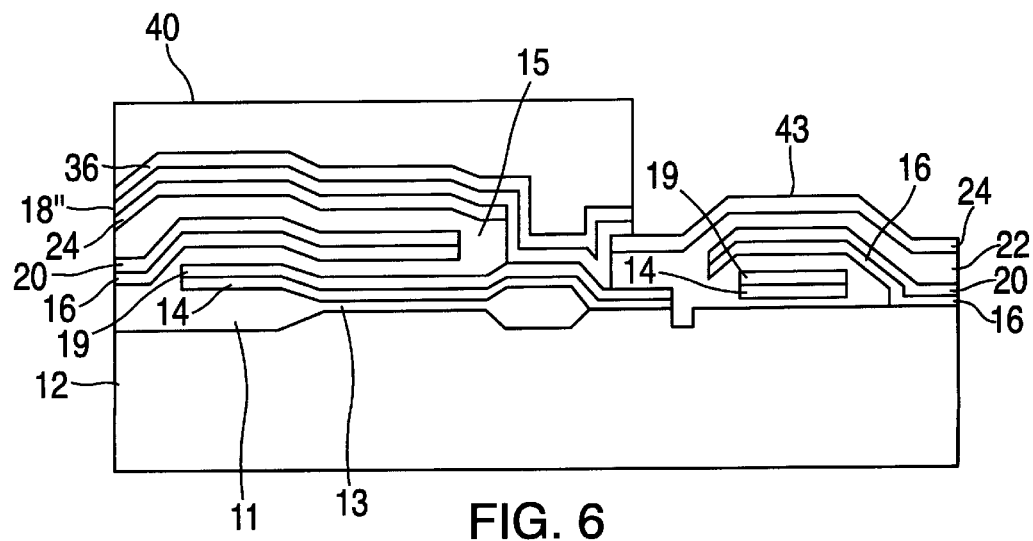

The unmasked portion 42 is then etched to form an etched surface portion 43 of the layer 24 as depicted in FIG. 6. The unmasked portion 42 can be etched using, for example, a plasma etcher or other suitable apparatus. The masked portion of the protected silicon layer 38 forms a portion of the polyresistors and/or connection lines. After this etching step, the patterned, developed first photoresist material 40 is removed, and the wafer is cleaned and dried. Due to the presence of the protective layer 36, the underlying polysilicon layer 18" suffers no detrimental effects from the photolithography, etching, and cleaning processes.

Figure 7:
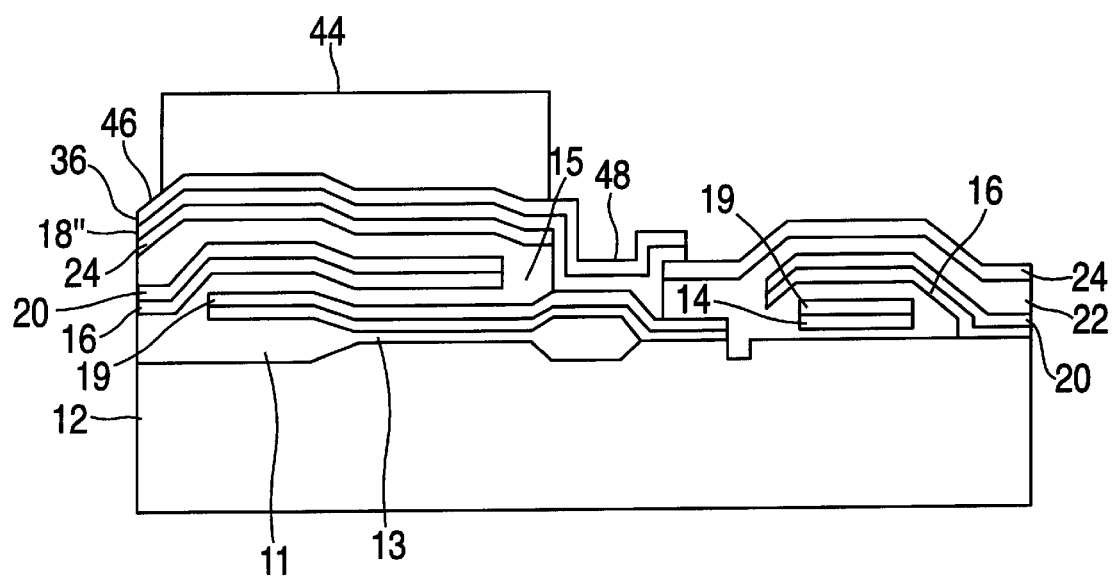

Next, photolithography is again employed, this time to define those portions of the protected polysilicon layer 38 which should be highly conductive in the finished SRAM device. Specifically, a second photoresist material layer is coated onto or deposited onto the upper surface of the protective layer 36 and the upper surface of the etched surface portion 43 of the layer 24. Then, the second photoresist material layer is aligned with a mask to expose a portion of the second photoresist material layer to a light that is illuminated through the mask. The exposed portions of the second photoresist material layer is then developed to form a patterned, developed second photoresist material layer 44 which, as illustrated in FIG. 7, defines a plurality of regions 46 and 48 of the masked portion of the protected silicon layer 38 that are now uncovered or exposed. The exposed areas 46, 48 are then implanted with a dopant, such as Arsenic or Phosphorous, which will render the areas 46 and 48 of the masked portion of the protected silicon layer 38 highly conductive. As with the conventional process, the species, dose, and energy of the implant are selected in a known way so that the conduction lines will have the desired level of conductivity. However, the species, dose, and energy of the implant may have to be changed from the conventional process so that the dopant can pass through the protective layer 36 and still achieve the desired effect upon the underlying polysilicon layer 18". It has been found that the implantation of Arsenic at a dosage of $1.5*10^{15}$ ions/$cm^2$ and an energy level of 80 KeV is effective, although other species, at other doses and energy levels could also be suitable. After implantation, the remaining photoresist material 44 is removed, and the wafer is cleaned and dried. The wafer is at this point ready for subsequent processing as necessary.

Due to the presence of the protective layer 36, the underlying polysilicon layer 18" suffers no detrimental effects from the photolithography, implanting, and cleaning processes. More specifically, the protective layer 36 insulates the polysilicon layer 18" against particulate contamination from the photolithographic process, eliminates the need for excessive cleaning with hydrofluoric acid, and shields the polysilicon layer 18" from the surface and thickness irregularities caused by cleaning procedures conducted in subsequent steps needed to complete the SRAM device fabrication process.

Thus it is apparent that in accordance with the present invention, an apparatus that fully satisfies the objectives, aims, and advantages achievable in accordance with the principles of the present invention is set forth in the above exemplary embodiments. While the invention has been described in conjunction with these exemplary embodiments, it is evident that many alternatives, modifications, permutations, and variations will become apparent to those skilled in the art in light of the foregoing description. Accordingly, it is intended that all such alternatives, modifications, permutations, and variations to the exemplary embodiments can be made without departing from the scope and spirit of the present invention.

We claim:

1. A method of fabricating a resistor element in a semiconductor device, the method comprising the following steps:

providing a substrate having disposed thereon a plurality of layers of different composition, said plurality of layers of different composition being generally disposed one layer on top of another layer, a portion of said plurality of layers of different composition forming a plurality of transistors, interconnect lines and inter-level insulating layers, at least one contact hole opening formed through at least one of said plurality of layers of different composition;

depositing a material layer on an uppermost layer of said plurality of layers of different composition;

depositing a protective layer onto said material layer to form a protected material layer; and forming said resistor element in said protected material layer, the step of forming said resistor element including implanting dopant at dosage levels between 0 and $5*10^{13}$ ions/cm$^2$, and at energy levels between 35 KeV and 80 KeV through said protective layer and into said material layer to control the resistivity and conductance of said resistor element; coating said protected material layer with a first photoresist material layer; masking, aligning, exposing, and developing said first photoresist material layer to form a patterned, developed first photoresist material layer that covers a masked portion of said protected material layer; etching an unmasked portion of said protected material layer that is not covered by said patterned, developed first photoresist material layer to form an etched surface portion; removing said patterned; developed first photoresist material layer from said masked portion of said protected material layer; coating said etched surface portion and said masked portion of said protected material layer, with a second photoresist material layer; masking, aligning, exposing, and developing said second photoresist material layer to form a patterned, developed second photoresist material layer that defines a plurality of highly conductive regions of said masked portion of said protected material layer; implanting dopant into said plurality of highly conductive regions of said masked portion of said protected material layer; and removing said patterned, developed second photoresist material layer.

2. The method of fabricating a resistor element in a semiconductor device according to claim 1, wherein the step of implanting dopant through said protective layer and into said material layer further includes:

implanting a dopant consisting of boron.

3. The method of fabricating a resistor element in a semiconductor device according to claim 1, wherein the step of implanting dopant through said protective layer and into said material layer further includes:

implanting a dopant consisting of phosphorous.

4. The method of fabricating a resistor element in a semiconductor device according to claim 1, wherein the step of implanting dopant through said protective layer and into said material layer further includes:

implanting a dopant consisting of arsenic.

5. The method of fabricating a resistor element in a semiconductor device according to claim 1, wherein said material layer is polysilicon.

6. The method of fabricating a resistor element in a semiconductor device according to claim 5, wherein said protective layer is made of silicon nitride.

7. A method of processing a silicon wafer to fabricate a load element for SRAMs, the method comprising the following steps:

providing a silicon wafer including a substrate having disposed thereon a plurality of layers of different composition, said plurality of layers of different composition being generally disposed one layer on top of another layer, a portion of said plurality of layers of different composition forming a plurality of transistors, interconnect lines and inter-level insulating layers, at least one contact hole opening formed through at least one of said plurality of layers of different composition;

depositing a material layer covering said silicon wafer and filling each of said contact holes;

depositing a protective layer onto said material layer to form a protected material layer;

implanting dopant at dosage levels between 0 and $5*10^{13}$ ions/cm$^2$, and at energy levels between 35 KeV and 80 KeV through said protective layer and into said material layer;

coating said protected material layer with a first photoresist material layer;

masking, aligning, exposing, and developing said first photoresist material layer to form a patterned, developed first photoresist material layer that covers a masked portion of said protected material layer, a portion of said masked portion of said protected material layer forming said load element;

etching an unmasked portion of said protected material layer that is not covered by said patterned, developed first photoresist material layer to form an etched surface portion of said silicon wafer;

removing said patterned, developed first photoresist material layer, and cleaning said masked portion of said protected material layer and said etched surface portion of said silicon wafer;

coating said masked portion of said protected material layer and said etched surface portion of said silicon wafer, with a second photoresist material layer;

masking, aligning, exposing, and developing said second photoresist material layer to form a patterned, developed second photoresist material layer that defines a plurality of highly conductive regions of said masked portion of said protected material layer;

implanting dopant into said plurality of highly conductive regions of said masked portion of said protected material layer; and removing said patterned, developed second photoresist material layer.

* * * * *